United States Patent
Culshaw et al.

(10) Patent No.: US 10,860,081 B2
(45) Date of Patent: Dec. 8, 2020

(54) ELECTRONIC DEVICE AND APPARATUS AND METHOD FOR POWER MANAGEMENT OF AN ELECTRONIC DEVICE

(71) Applicant: FREESCALE SEMICONDUCTOR, INC., Austin, TX (US)

(72) Inventors: Carl Culshaw, Wigan (GB); Gordon James Campbell, Strathaven (GB); Alistair James Gorman, Broughty Ferry (GB); Mark Maiolani, Glasgow (GB); David McMenamin, Glasgow (GB)

(73) Assignee: NXP USA, Inc., Austin, TX (US)

( * ) Notice: Subject to any disclaimer, the term of this patent is extended or adjusted under 35 U.S.C. 154(b) by 80 days.

(21) Appl. No.: 15/024,435

(22) PCT Filed: Sep. 27, 2013

(86) PCT No.: PCT/IB2013/058935
§ 371 (c)(1),
(2) Date: Mar. 24, 2016

(87) PCT Pub. No.: WO2015/044717
PCT Pub. Date: Apr. 2, 2015

(65) Prior Publication Data
US 2016/0231805 A1     Aug. 11, 2016

(51) Int. Cl.
*G06F 1/00*     (2006.01)
*G06F 1/3287*   (2019.01)
(Continued)

(52) U.S. Cl.
CPC .......... *G06F 1/3287* (2013.01); *H02J 4/00* (2013.01); *H03K 19/0016* (2013.01); *G06F 1/3203* (2013.01); *Y02D 10/00* (2018.01)

(58) Field of Classification Search
CPC ...... G06F 1/3287; H02J 4/00; H03K 19/0016; Y02D 10/171
(Continued)

(56) References Cited

U.S. PATENT DOCUMENTS 6,105,139 A     8/2000  Dey et al.
6,802,014 B1 *  10/2004  Suurballe ............. G06F 1/3203
                                                  713/300

(Continued)

OTHER PUBLICATIONS

International Search Report for the International application No. PCT/IB2013/058935 dated Sep. 27, 2013.

*Primary Examiner* — Volvick Derose

(57) ABSTRACT

An electronic device, typically a microcontroller, which is divided into a multiplicity of power domains comprising one or more intelligent peripherals, is provided with an on-board power management module for switching power to one or more domains for pre-determined time periods and in a predetermined sequence. The values of the predetermined time periods and sequence may be pre-programmed by the design engineer or user of the device. In one example, power is switched to domains in a round robin fashion. An optional interrupt capability permits selective application of power to a dormant intelligent peripheral requesting it at the expense of others and based on a priority scheme. Consumption of current supplied to power domains may be monitored by a power watchdog or alternatively via a dedicated power monitor associated with each intelligent peripheral. The invention helps to reduce device power consumption without any associated reduction in processing performance.

20 Claims, 2 Drawing Sheets

(51) Int. Cl.
   *H03K 19/00*      (2006.01)
   *H02J 4/00*       (2006.01)
   *G06F 1/3203*     (2019.01)

(58) Field of Classification Search
   USPC .......................................................... 713/324
   See application file for complete search history.

(56) References Cited

U.S. PATENT DOCUMENTS

| | | | |
|---|---|---|---|
| 6,826,704 B1 | 11/2004 | Pickett | |
| 7,941,682 B2 | 5/2011 | Adams | |
| 8,543,226 B2 | 9/2013 | Shah et al. | |
| 8,791,743 B1* | 7/2014 | Tang | H03K 3/356104 327/333 |
| 2006/0165096 A1* | 7/2006 | Heath | H04L 12/10 370/395.53 |
| 2006/0184808 A1* | 8/2006 | Chua-Eoan | G06F 1/3203 713/300 |
| 2008/0229121 A1* | 9/2008 | Lassa | G06F 1/3203 713/300 |
| 2009/0144571 A1* | 6/2009 | Tatsumi | G06F 1/3287 713/320 |
| 2009/0203409 A1* | 8/2009 | Castor | G06F 1/325 455/574 |
| 2009/0293072 A1* | 11/2009 | Elshocht | G06F 1/3228 719/327 |
| 2010/0191385 A1* | 7/2010 | Goodnow | G06F 1/305 700/291 |
| 2011/0198923 A1* | 8/2011 | Cheng | G06F 1/26 307/31 |
| 2011/0283130 A1* | 11/2011 | Pai | G06F 1/26 713/330 |
| 2012/0072743 A1* | 3/2012 | Lee | G06F 1/3287 713/300 |
| 2012/0120306 A1* | 5/2012 | Schindler | G06F 1/32 348/372 |
| 2013/0111254 A1 | 5/2013 | Takayanagi et al. | |
| 2013/0166089 A1 | 6/2013 | Craig et al. | |
| 2013/0173938 A1* | 7/2013 | Yang | G06F 1/26 713/300 |

* cited by examiner

ELECTRONIC DEVICE AND APPARATUS AND METHOD FOR POWER MANAGEMENT OF AN ELECTRONIC DEVICE

FIELD OF THE INVENTION

This invention relates to an electronic device and to an apparatus and method for power management of an electronic device and has particular application, though not exclusive, to power scheduling for an electronic device such as a microprocessor or microcontroller and is particularly suitable for application to electronic devices which may be divided into power domains or islands.

BACKGROUND OF THE INVENTION

Power consumption in devices such as microcontrollers becomes an ever increasing problem with the reduction in size of semiconductor devices as smaller geometries tend to have larger leakage currents. Various techniques have been proposed for reducing the power consumption of microcontrollers and microprocessors. One specific power reduction technique involves stopping (or "gating") the clock signals that drive inactive circuit portions. A similar technique involves the capability of reducing the frequency of clock signals that drive circuit portions during operating modes which are not time critical. U.S. Pat. No. 6,826,704 describes a system which employs a performance throttling mechanism so that a reduced number of execution units are active at any one time. Another method, mentioned in U.S. Pat. No. 7,941,682 puts currently inactive parts of a circuit into a sleep mode. Another technique which can reduce current leakage involves the removal (or "gating") of power from inactive circuit portions.

SUMMARY OF THE INVENTION

The present invention provides an electronic device and an apparatus and a method for power management of an electronic device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
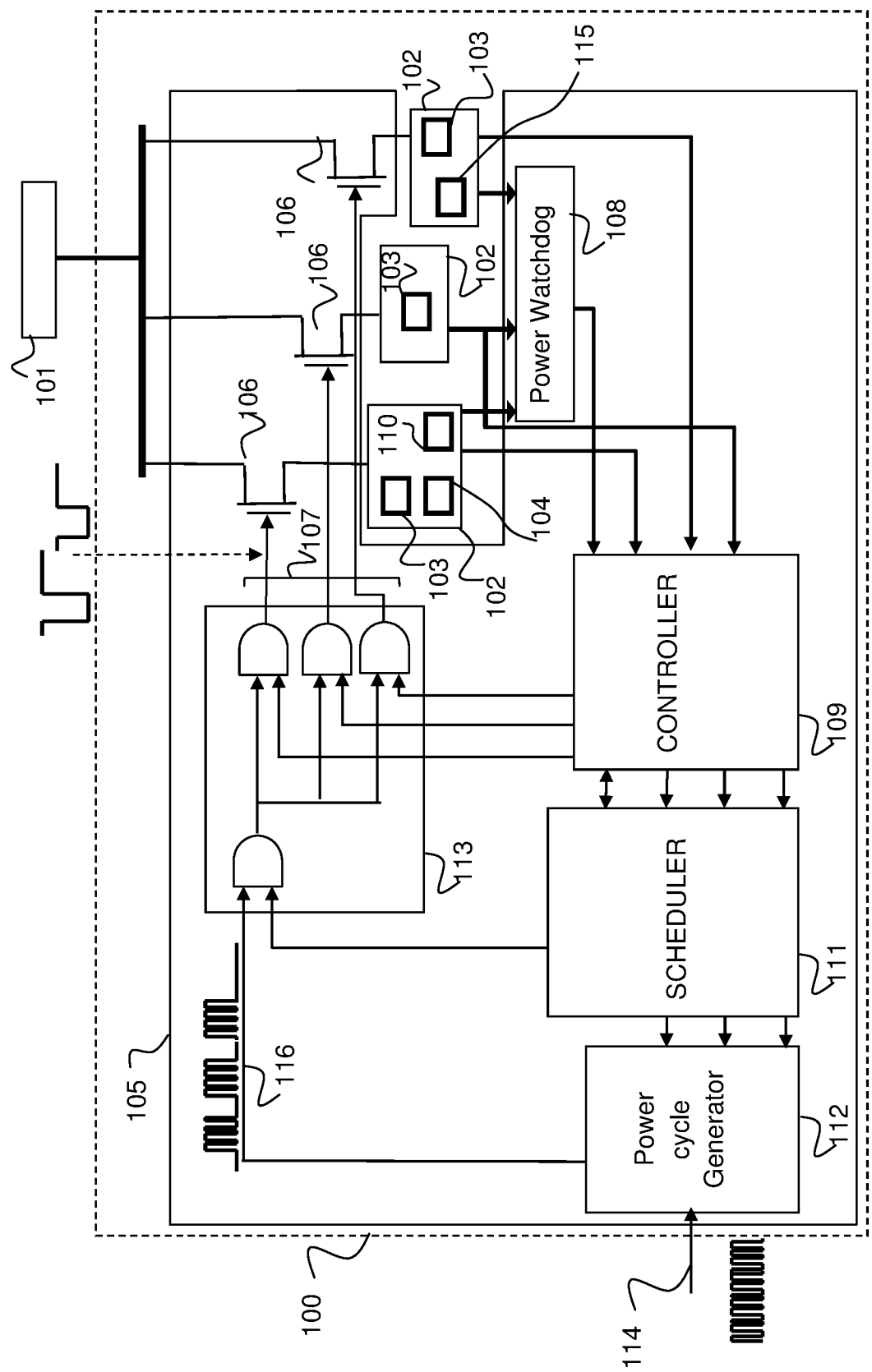
FIG. 1 is a simplified block diagram of an example of an electronic device comprising a power management capability.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

An electronic device 100 may receive power from an external power supply 101. The electronic device 100 may be a processor for example. The processor 100 may for example be a microprocessor, such as a general purpose microprocessor, a microcontroller, a coprocessor, a digital signal processor or an embedded processor. The processor may have one or more processor cores. The processor may, in addition to the processor core, further comprise inputs/outputs and/or other components, such as communication interface, e.g. external bus interfaces, DMA (Direct Memory Access) controllers, and/or coprocessors and/or analog-to-digital converters and/or clocks and reset generation units, voltage regulators, memory (such as for instance flash, EEPROM, RAM), error correction code logic and/or timers, and/or hardware accelerators or other suitable components. The processor may for example be implemented as an integrated circuit, that is, on one or more dies provided in a single integrated circuit package.

The processor 100 may comprise a plurality of regions 102 or "power domains" or "power islands" which may be arranged so that they can be independently and selectively powered. Each region 102 may comprise one or more functional modules 103 sometimes referred to as "intelligent peripherals. Functional modules may comprise for example a controller area network (CAN), local interconnect network (LIN), Ethernet, a timer. Each of the functional 103 modules comprising a region may be connected together in a "power" sense such that when power is applied to a region, all functional modules comprising that region receive power and are "active" and when power is removed from a region, all other functional modules comprising that region may go into a "sleep" mode and are considered to be "inactive." One region may be deemed to have a higher priority than other regions. More than one region may be powered on simultaneously.

In the example of FIG. 1 three regions 102 are illustrated. A first region may comprise three functional modules which may be a timer, a direct memory access (DMA) module and an analog to digital converter. A second region may comprise a serial peripheral interface (SPI) and a LIN. A third region may comprise a Media Local Bus (MLB) and an Ethernet module. One or more of the functional modules 103 may be provided with an associated power monitor 104 for monitoring the current consumed by a functional module 103 with which it may be associated.

The processor 100 may include a power management module 105 for selectively controlling the application of power (supplied by the external power supply 101, for example) to each region 102 for predetermined time periods and in a predetermined sequence. In another example, the power management module 105 may be a separate device which may be connected in a suitable manner to an electronic device such as a microprocessor or microcontroller for example which comprises a plurality of power domains.

The power management module 105 may comprise one or more switching elements 106. In one example embodiment a switching element may comprise a CMOS power transistor. Each switching element may be operably coupled between the external power supply 101 and one of the regions 102 and arranged to switch power to the region to which it is operably coupled in response to a control signal on one of an associated control line 107.

The power management module 105 may comprise a power watchdog 108 operably coupled to each region 102 and may be arranged to monitor the power consumed by each region. The power watchdog 108 may also be operably coupled to a power monitor 104 associated with a functional module 103 for receiving a measurement of current consumed by the module, for example. The power management module 105 may also comprise a controller 109. The power watchdog 108 and each region 102 may be operably coupled to the controller 109. The controller 109 may, in one example embodiment, comprise a finite state machine and may have an interrupt control capability.

In one example embodiment, one or more functional modules 103 may be provided with a power request module 110 for generating a request for power to be applied to the region comprising that functional module.

The power management module 105 may also comprise a scheduler 111, a power cycle generator 112, and a logic block 113. The controller 109 may be operably coupled with the scheduler 111 and to inputs of the logic block 113. The power cycle generator 112 may be operably coupled to the scheduler 111 and to the logic block 113. The power cycle generator 112 may receive a signal from an external clock source (not shown) on line 114. The external clock source may be a low-power clock source. The power cycle generator 112 may produce a power clock signal on its output which may be operably coupled to an input of the logic block 113. The logic block 113 may comprise, in one example, a plurality of AND gates. The outputs of the logic block 113 may comprise the aforementioned control signal lines 107 for controlling the switching elements 106. The scheduler 111 may be provided with a timer facility.

In one embodiment, a region 102 may include a power baton controller 115 which may be arranged to inhibit removal of power from the region holding the baton until a particular task is completed by one or more of the functional modules 103 which are included in the region. In an alternative embodiment, a functional module 103 may include a power baton controller 115 which may be arranged to inhibit removal of power from the functional module holding the baton until a particular task is completed by that functional module.

The power management module 105 may be arranged to operate such that at specific timed intervals it will power-on certain regions 102 whilst keeping others off. So for example during a first time interval T1, functional modules comprising a first region 102 of FIG. 1 are powered on and therefore active while the functional modules comprising second and third regions are powered off and inactive. At the end of the first time interval T1, the power management module 105 may be arranged to simultaneously remove power from the first region and to switch power to the second and third regions. This situation may persist for a second time interval T2 whereby at the end of this second time interval, different region or regions are powered on and off in accordance with a pre-determined power switching schedule which may be stored in or programmed into the scheduler 111. Application of power to the region may be facilitated by the switching elements 106 under the control of the logic block 113. A user of the processor 100 may set the time intervals and predetermined power switching schedule via a user interface (not shown) to the power management module 105. Alternatively the processor design engineer may set the time intervals and power switching schedule.

Exemplary embodiments may thus enable immediate (that is a low latency) and automatic response to a power demand by direct adjustment of the powering of regions (power domains) of an electronic device and without requiring any software modification. In one embodiment, a maximum power budget for each of the regions comprising the electronic device may be set and the power management module 105 may be arranged to switch power to the various regions such that this maximum power budget is not exceeded at any one time.

In one example embodiment the power management module 105 may be arranged to operate as a fixed time bound switching matrix (as is known in the art) whereby power is switched to the appropriate regions in the round robin fashion. Those regions which are to be active during a pre-determined time interval may be assigned an active timeslot for consuming power with the remaining regions being forced to be inactive.

Advantageously, the powering of individual regions of an electronic device such as a microcontroller independently of each other allows a power budget to be smoothed across an application lifetime, thereby minimising maximum power. A minimisation of maximum power allows a maximum thermal budget to be reduced. This results in a reduced system cost since the amount of thermal exchange is also reduced. Further, minimising maximum power allows external regulator support infrastructure to be downsized, saving power cost and size.

In one example embodiment, the power management module may be arranged to assert a power interrupt on receipt, for example, of a request for power from a functional module currently in a sleep mode, thereby ensuring that all regions 102 still retain the capability to power-up in a synchronous manner.

A further advantage of the example embodiments is that they do not require an increase in software overhead.

The functionality of the components comprising the power management module 105 will now be described in greater detail with reference to FIG. 1. A clock signal from a low power clock source (not shown) may be provided at an input of the power cycle generator 112. The power cycle generator 112 may be arranged to generate a power clock signal on its output on line 116, the signal having a specific mark/space ratio which may be specified by the scheduler 111 which in turn, may be under the control of the controller 109. For example, the scheduler 111, driven by the controller 109 may create a clock window requirement for the power cycle generator 112. Depending on the requirement, the power clock signal may then be adjusted accordingly.

The logic block 113 may receive the power clock signal and also may receive inputs from the scheduler 111 and the controller 109. The controller 109 may provide an enable signal to the logic block in respect of a region 102 in order to set those regions 102 which are to be powered "on" during a next power clock cycle. So for example, one of the outputs from the logic block 113 may be set high, for example, so driving one of the switching elements "on" resulting in power being applied to that region 102 associated with that switching element 106 (for as long as the switching element is held on). Conversely one of the outputs from the logic block 113 may be set low, so holding one of the switching elements 106 off and thereby resulting in power being removed or withheld from the region 102 associated with that switching element 106.

The power watchdog 108 may signal to the controller 109 that power in a particular region 102 is within acceptable limits. The power watchdog 108 may also monitor how many regions are powered at any time. Additionally, it may monitor the total power consumed by the processor 100 in order to ensure that device-wide limits are being respected.

In the event that limits are about to be crossed, it may be arranged to raise an exception to the controller 109.

Each functional module 103 may raise a request for power in the form of an interrupt, for example. In one example, this may be done by a power request module 110 associated with a functional module whereby, in response to the request, a flag may be raised (in the controller, for example) signifying that the region comprising that functional module should be powered. The controller 109 may be arranged to pass on an interrupt to the scheduler 111 or, alternatively, to ignore it until a more suitable power window occurs.

Figure 2:
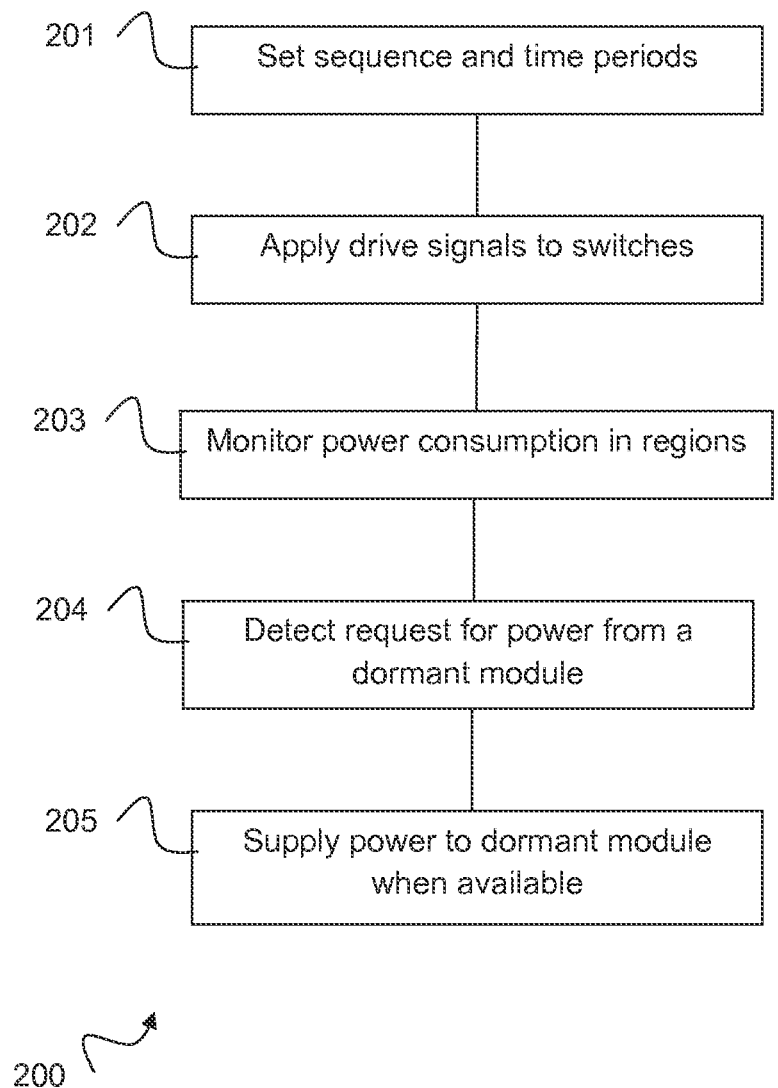
FIG. 2 is a simplified flowchart of an example of a method for power management of an electronic device.

Some examples of a method for power management of an electronic device will now be described with reference to FIG. 1 and to the simplified flowchart of FIG. 2. At 201, a powering sequence for the various regions 102 may be set. Time periods for which the individual regions may be powered may also be set. Optionally, a maximum power value may be set. At 202, drive signals may be applied on one or more control lines 107 to appropriate switching elements 106 in order to switch power from the external power supply 101 to a region 102 for the purpose of powering the functional modules 103 included within that region. Functional modules included in regions which are not powered during any particular time period are "dormant" and may be put into a sleep mode.

At 203 the power or current consumed within the regions 102 may be monitored. In one example, if a maximum power value has been set, the power management module may be arranged to ensure that this maximum power value becomes a constant average power consumed by the processor. This has the advantage that power dips and surges may be filtered out. This may be achieved by pre-loading the scheduler 111 with a preset value of current for each functional module 103 in each region 102 for each preset time period. In one example, current consumed by a functional module 103 may be measured by a current monitor 104 associated with the functional module 103. Alternatively, current consumed may be monitored by the power watchdog 108. The schedule 111 may be preloaded with a maximum current value that an application wishes to consume. The power management module 105 may then ensure that this maximum current value is not exceeded. This may be done by limiting the number of regions receiving power at any one time.

An interrupt control facility, within the controller 109 of FIG. 1 for example, may be arranged whereby the power management module 105 has the capability to detect any activity within a dormant functional module 103. In one example, each functional module may be provided with a power request module 110 for requesting power to be supplied to it. This power request module may assert this request as an interrupt signal to the controller 109 on occurrence of certain predefined events. Hence at 205, the power management module 105 may detect a request for power from a dormant functional module 103 by receiving an interrupt signal. The controller 109 may then service this interrupt signal by indicating to the scheduler 111 that an exception has occurred and that power must be applied to the region 102 which includes the dormant functional module which has raised the request.

In one exemplary embodiment, the interrupt signals may be priority based. In such a case, a request for power from a dormant functional module 103 may be ignored or queued until a suitable power window occurs. For example, an interrupt control capability in the controller 109 may be arranged to allow the received interrupt signals to be masked by a set of "inhibit" or "mask" flags, for example. In this way, the power management module 105 may disallow certain conditions and ignore the requests for power to be applied to a dormant functional module 103. Alternatively, the request for power may be placed in a standard queue system and the power management module may be arranged to determine when enough power is available to service the request and to apply the power accordingly (at 206).

In an alternative arrangement, a "power baton" concept may be employed whereby each functional module 103 may effectively take control of the power to the region 102 in which it is located or solely to itself until a particular task is completed and then relinquish power ownership by passing the baton on to a second functional module. This second functional module may be included in the same region or may be in a different region. Such a power baton or power token may be a control flag whereby a functional module would maintain power to itself at the exclusion of other dormant functional modules. Once the controlling functional module controlling the power baton has completed its task it may release the power baton (or token) and pass it along to another functional module by means of a simple notification scheme via a register control for example. Once the power baton is released, the releasing functional module may power itself down whereupon a newly enabled functional module may take over and power itself up.

It will be appreciated from the foregoing that an electronic device (such as a microcontroller) which includes examples of the power management module 105 may exhibit certain advantages. For example, such a microcontroller may be arranged to include a power scheme designed to prevent simultaneous operation of all regions of the microcontroller. Further, the microcontroller may operate a power scheme which is designed to operate independent power domains in a controlled manner. The microcontroller may also have the capability to assert a power interrupt even when certain sections of the microcontroller are powered down. The microcontroller may be configured to respond to power interrupts, determine priorities and take appropriate power allocation decisions. The microcontroller may be arranged to allow time division of power with a variable duty cycle between power domains. The microcontroller may be arranged in order to ensure that at least one power domain is not affected by power excursions. The microcontroller may also be arranged to determine the optimum power delivery to each domain. The microcontroller may be configured such that power ownership may be passed from a section comprising one or more functional modules of the microcontroller to another. The microcontroller may be configured whereby power is switched from one region to another with an applied power smoothing scheme thereby preventing spurious power spikes or dips.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

As an example, a tangible computer program product may be provided having executable code stored therein to perform a method for power management in an electronic device. A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each logical signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the logical signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic and functional blocks are merely illustrative and that alternative embodiments may merge logic and functional blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the functionality of the controller 109, scheduler 111, logic block 113 and power cycle generator 112 of FIG. 1 may be combined and implemented in one or more modules. Further, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The electronic device of FIG. 1 comprising a power management capability may be implemented in an integrated circuit. Such an integrated circuit may be a package containing one or more dies. Alternatively, the power management module 105 may be implemented in a separate integrated circuit device which may be connected with an electronic device, such as a microcontroller or microprocessor, in a suitable manner for managing power thereof. An integrated circuit device may comprise one or more dies in a single package with electronic components provided on the dies that form the modules and which are connectable to other components outside the package through suitable connections such as pins of the package and bondwires between the pins and the dies.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. Apparatus for the management of power in an electronic device comprising:
   a power management module and a plurality of independently-powerable regions wherein each region comprises at least one functional module,
      a first particular region includes a first power baton controller and the power management module is arranged to selectively switch power to one or more of said regions in a pre-determined sequence, and to power off another one of the regions while power is provided to the one or more of the regions,
      the power management module to detect that a power baton is held by the first power baton controller and to inhibit removal of power to the first particular region and power off the other one of the regions while the power baton is held by the first power baton controller, wherein the power management module ignores the pre-determined sequence in response to the power baton being held by the first power baton controller.

2. The apparatus of claim 1, the power management module comprising a plurality of switching elements for coupling to a respective one of said regions wherein each of said switching elements is arranged to switch power to a region in accordance with a control signal.

3. The apparatus of claim 1 arranged to switch power to each of said regions in a round robin fashion.

4. The apparatus of claim 1 comprising a current monitor arranged to monitor current consumed by one or more functional modules and arranged to limit a consumed current to a pre-set maximum value.

5. The apparatus of claim 1 comprising an interrupt controller arranged to detect a request for power at from at least one functional module.

6. The apparatus of claim 5 wherein the interrupt controller is arranged to generate a control signal for allowing power to be switched to the region comprising the at least one functional module requesting power.

7. The apparatus of claim 1, wherein the first power baton controller releases the power baton in response to a completion of a task by a functional module of the first particular region.

8. The apparatus of claim 7 wherein:
   a second particular region includes a second power baton controller:
      in further response to the completion of the task, the first power baton controller passes the power baton to the second power baton controller and the functional module powers itself down; and
      the apparatus detects that the power baton is held by the second power baton controller and continues to provide power to the second particular region while the power baton is held by the second power baton controller.

9. The apparatus of claim 7 wherein the first power baton controller passes the power baton to the second power baton controller using a control register.

10. An electronic device comprising:
    a power management module;
    a plurality of independently-powerable regions wherein each region comprises at least one functional module, and
    wherein a particular region includes a power baton controller; and
    wherein the power management module is arranged to selectively switch power to one or more of said regions for pre-determined time periods and in a pre-determined sequence, to power off another one of the regions while power is provided to the one or more of the regions, to detect that a power baton is held by the power baton controller, and to inhibit removal of power to the particular region and power off the other one of the regions while the power baton is held by the power baton controller, wherein the power management module ignores the pre-determined sequence in response to the power baton being held by the power baton controller.

11. The electronic device of claim 10 arranged to inhibit removal of power by the power management module from a powered region until a particular task has been completed by one or more functional modules comprising the region.

12. The electronic device of claim 10, wherein the power management module comprises a plurality of switching elements for coupling to a respective one of said regions, wherein each of said switching elements is arranged to switch power to a region in accordance with a control signal.

13. The electronic device of claim 10 arranged to switch power to each of said regions in a round robin fashion.

14. The electronic device of claim 10 comprising a current monitor arranged to monitor current consumed by one or more functional modules and arranged to limit a consumed current to a pre-set maximum value.

15. The electronic device of claim 10 comprising an interrupt controller-arranged to detect a request for power at from at least one functional module.

16. The electronic device of claim 15 wherein the interrupt controller is arranged to generate a control signal for allowing power to be switched to the region comprising the at least one functional module requesting power.

17. A method for power management of an electronic device comprising a plurality of independently-powerable regions and a power management module, the method comprising:

selectively switching power to one or more of said regions for pre-determined time periods and in a predetermined sequence;

powering off another one of the regions while power is provided to the one or more of the regions;

detecting, by the power management module, that a power baton is held by a power baton controller, the power baton controller being included in a particular region; and inhibiting removal of power to the particular region and power off the other one of the regions while the power baton is held by the power baton controller, wherein the electronic device ignores the pre-determined sequence in response to the power baton being held by the power baton controller.

18. The method of claim 17 comprising monitoring current consumed by one or more functional modules to limit a consumed current to a pre-set maximum value.

19. The method of claim 17 comprising detecting a request for power at from at least one functional module.

20. The method of claim 19 comprising generating a control signal for allowing power to be switched to the region comprising the at least one functional module requesting power.

* * * * *